United States Patent [19]
Holden et al.

[11] Patent Number: 5,262,972
[45] Date of Patent: Nov. 16, 1993

[54] MULTICHANNEL DIGITAL FILTER APPARATUS AND METHOD

[75] Inventors: Kenneth Holden, Ontario; Don C. Dunkerley, Chino, both of Calif.

[73] Assignee: Hughes Missile Systems Company, Los Angeles, Calif.

[21] Appl. No.: 731,059

[22] Filed: Jul. 17, 1991

[51] Int. Cl.$^5$ ............................................. G06F 15/31
[52] U.S. Cl. ............................................. 364/724.13
[58] Field of Search ............ 364/724.01, 724.05, 364/724.13, 724.16

[56] References Cited

U.S. PATENT DOCUMENTS

| | | | |
|---|---|---|---|
| 3,665,171 | 5/1972 | Morrow | 235/152 |
| 4,323,980 | 4/1982 | Houdard et al. | 364/724 |
| 4,507,725 | 3/1985 | Christopher et al. | 364/724 |
| 4,698,680 | 10/1987 | Lewis, Jr. et al. | 358/166 |
| 4,766,561 | 8/1988 | Thompson et al. | 364/724.13 |
| 4,771,395 | 9/1988 | Watanabe et al. | 364/724.16 |
| 4,782,458 | 11/1988 | Bhattacharya et al. | 364/724.16 |

FOREIGN PATENT DOCUMENTS

| | | | |
|---|---|---|---|
| 256288 | 2/1988 | European Pat. Off. | 364/724.01 |
| 107322 | 8/1980 | Japan | 364/724.17 |
| 2104695 | 3/1983 | United Kingdom | 364/724.16 |

OTHER PUBLICATIONS

Windsor et al., Simplify FIR-Filter Design With A Cookbook Approach, EDN (1983).

*Primary Examiner*—Long T. Nguyen
*Attorney, Agent, or Firm*—Charles D. Brown; Randall M. Heald; Wanda Denson-Low

[57] ABSTRACT

A multichannel filter architecture having an external sequencer to provide timing and control signals which enable the filter to function as a plurality of filters because of its multiplexing operation. The filter samples input data and applies the filter functions to each sample. There may be a single input composed of either a single input or multiple time-multiplexed inputs. The multiplexing functions the same way independent of the input form. The filter functions are programmable and reprogrammable, allowing them to be changed by software rather than a redesign of hardware for a new filter function.

9 Claims, 5 Drawing Sheets

MULTICHANNEL DIGITAL FILTER APPARATUS AND METHOD

FIELD OF THE INVENTION

This invention relates generally to digital filters and, more particularly, to a single parallel pipeline input filter architecture employing random access memory and multiplexing circuitry for multiple channel operation, and the method for filtering data.

BACKGROUND OF THE INVENTION

Digital filters have been available for many years. Digital signal processing (or time series analysis) is employed in many diverse fields and is extremely useful where a great deal of data must be filtered. Examples of such data are digitized photos and voice data which can be "computer enhanced." Digital filters process information by performing a predetermined set of arithmetic operations on digitally coded samples of that information. More specifically, digital filtering consists of taking what are typically equidistant discrete-time samples of a continuous-time function, or values of some discrete-time process, and performing operations such as discrete-time delay, multiplication by a constant and addition to obtain the desired result.

An advantage of digital filters as signal processing devices is that they can be used to process data from several sources or channels simultaneously. This is generally accomplished by applying samples from each of the sources to the filter in a predetermined sequence, such as by means of time division multiplexing of the samples. By providing several sets of filter coefficients, it is possible to process data from each source using a different transfer function.

A typical digital filter is a finite impulse response (FIR) filter. There are others, including infinite impulse response filters. FIR filters have operated with serial stream delays. These architectures tend to limit the speed of the sum-of-products operation used to implement the convolution sum equation.

FIR filters perform a sum-of-products operation to implement the convolution sum. The convolution equation is represented as follows:

$$y(n) = h(n) * (x) \qquad (Eq.\ 1)$$

where * represents the convolution operator. The convolution sum is further represented by the equation:

$$y(n) = \sum_{m=1}^{N} h(m) \times (n - m) \qquad (Eq.\ 2)$$

These are the well recognized and standard convolution equations.

Faster filter speeds have been realized for the use of serial stream data entry where the input data is operated on in a parallel fashion for the use of many multipliers/accumulators. This has been one of the more common digital filter architectures. It uses a single pipeline of many multipliers/accumulators to achieve the sum-of-products operation.

Expanding prior art filters for additional channels and additional coefficients to operate on the input data has been cumbersome at best. Size and operational complexities have tended to limit the number of channels and, more importantly, the speed at which these digital filters can be made to operate.

SUMMARY OF THE INVENTION

Broadly speaking, this invention relates to a multichannel digital filter utilizing a single parallel pipeline architecture, and more specifically incorporating random access memory for storage of the internal data including coefficients and sum-of-products, and means for multiplexing the memories for multiple channel operation. The parallel nature of the single pipeline architecture allows faster operation of the filter and the multiplexing of memory allows multiple filter functions to be performed within the same hardware. Using this multichannel capability allows the user more flexibility in design. Different sampling periods, unique filter functions, that is, lowpass, highpass or bandpass, can be implemented with one device for a single input signal, or multiple input signals. Also, by having the multichannel capability, that is, multiple inputs which are switched and sampled in sequence, size, weight and power reduction are achieved for strict design and cost savings requirements.

What is referred to as common architecture utilizes a single pipeline of many multipliers/accumulators to achieve the sum-of-products operation. In previously available devices, external control is provided for other functions such as downloading of coefficient values, clocking and cascading of additional filters for more complex filter functions. The invention employs the single pipeline with parallel multipliers/accumulators of the common architecture but with the addition of random access memory and multiplexing circuitry. The addition of random access memory and multiplexing circuitry allows multichannel filter capability. The random access memory is used to store the channel coefficients and the results of the sum-of-products operations. The multiplexing is segmented into two parts. The first part controls the channel coefficient data memory and the second part controls the sum-of-products memory.

Operation of the filter is accomplished by performing the convolution sum equation in hardware. For multichannel operations, data is multiplexed such that data for channel one is operated on in parallel by the coefficients for channel one and the results are stored in memory for channel one. This same operation is performed for all of the channels. The control needed for filter operation is provided by an external sequencer which is programmable. This sequencer produces the actual control signals with the appropriate timing for operation of the filter hardware. By being programmable, the user can choose how to control the filter. For example, each filter channel may be sampled at a different sample period.

BRIEF DESCRIPTION OF THE DRAWING

The objects, advantages and features of this invention will be more clearly perceived from the following detailed description, when taken in conjunction with the accompanying drawing, in which.

DESCRIPTION OF THE PREFERRED EMBODIMENTS

Figure 1:
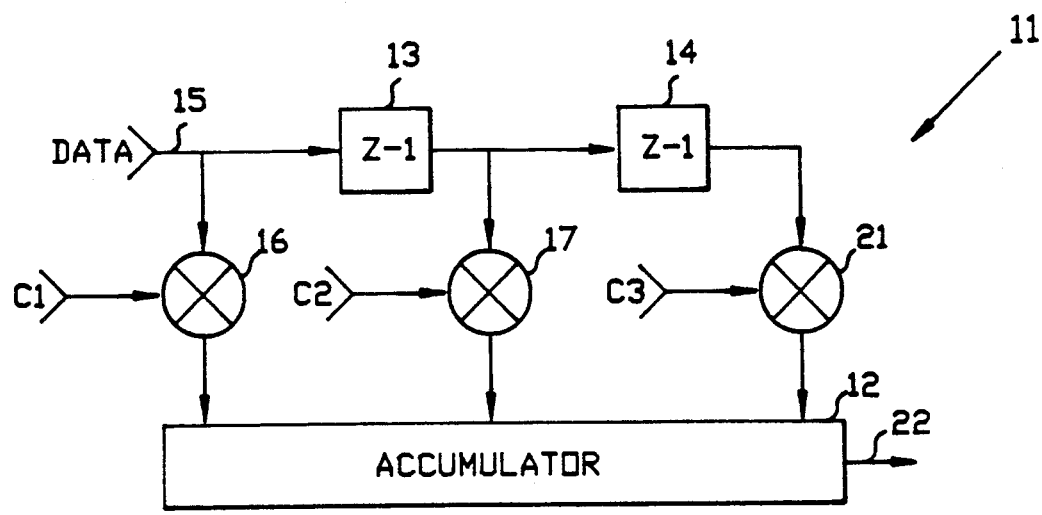
FIG. 1 is a block diagram representing the canonical finite impulse response filter architecture of the prior art.

With reference now to the drawing, and more particularly to FIG. 1, there is shown the canonical implementation of prior art filter 11. Note that there is only one accumulator 12 and delays 13 and 14 are arranged in a serial stream. Delays in this serial implementation reduce the speed of the sum-of-products operation used to implement the convolution sum equation (filter operation). Data enters on line 15 and is multiplied by coefficient C1 in multiplier 16, the product then proceeding to the accumulator. Similarly, after passing through delay 13 the input data enters multiplier 17 where it is multiplied by coefficient C2 and then that product proceeds to the accumulator. Finally, the input data passes through second delay 14 and is then multiplied by coefficient C3 in multiplier 21 and then on to accumulator 12. The output of this filter appears on line 22 extending from the accumulator.

Figure 2:
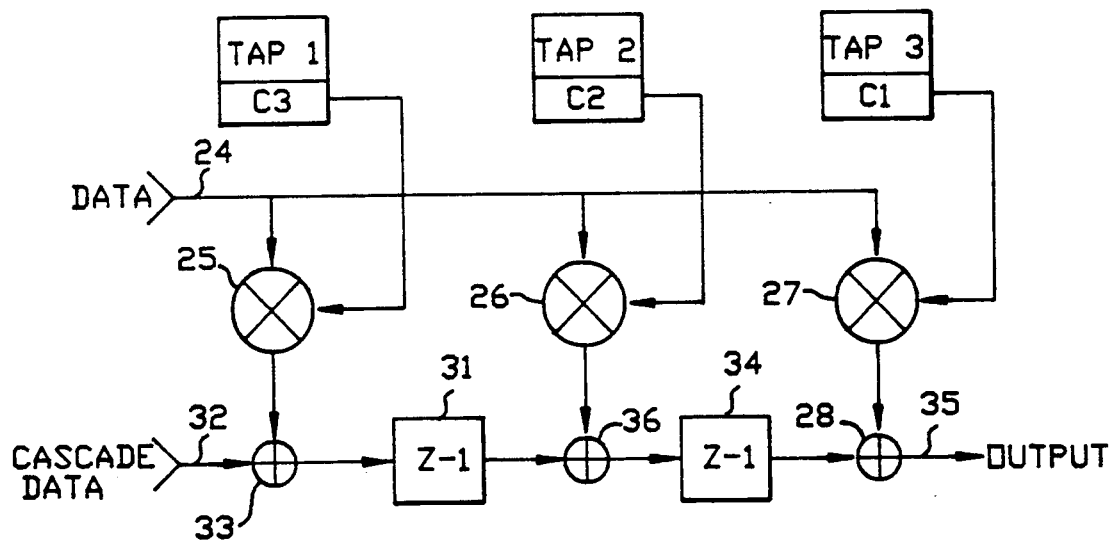
FIG. 2 is a block diagram of the common filter architecture of the prior art.

An architecture that implements the sum-of-products operation but can operate at faster speeds than the embodiment of FIG. 1 is shown in FIG. 2. This prior art architecture uses many multiply/accumulate functions and changes the location of the delays. These changes allow the output of the filter to be available after a single delay after the pipeline is full, instead of the many delays that result from using a single accumulator as in FIG. 1. The architecture shown in FIG. 2 is currently that which is most commonly used for implementation of finite impulse response (FIR) filters. Note that the data moves through the filter in a serial stream, while the data is operated on in a parallel fashion by the use of many multipliers/accumulators.

Specifically, in the FIG. 2 filter data enters on line 24 and is modified by coefficient C3 from TAP 1 in multiplier 25. Simultaneously, the data is modified by coefficient C2 in multiplier 26 and by coefficient C1 in multiplier 27. The output of multiplier 25 is then applied to summing junction 33 where it is added with data from the previous tap. This new sum then proceeds to delay 31. If multiplier 25 is not the first in the series, cascade data from the sequentially prior delay element would be applied through line 32 to summing junction or accumulator 33. Similarly, the data from delay 31 is added to the output of multiplier 26 in junction 36 and applied to delay 34. That data is then added to the output of multiplier 27 in junction 28 to form the output of the filter on line 35. This common architecture utilizes a single pipeline of many multipliers/accumulators to achieve the sum-of-products operation. External control is provided for other functions such as downloading of coefficient values, clocking, and cascading of additional filters for more complex filter functions.

Figure 3:
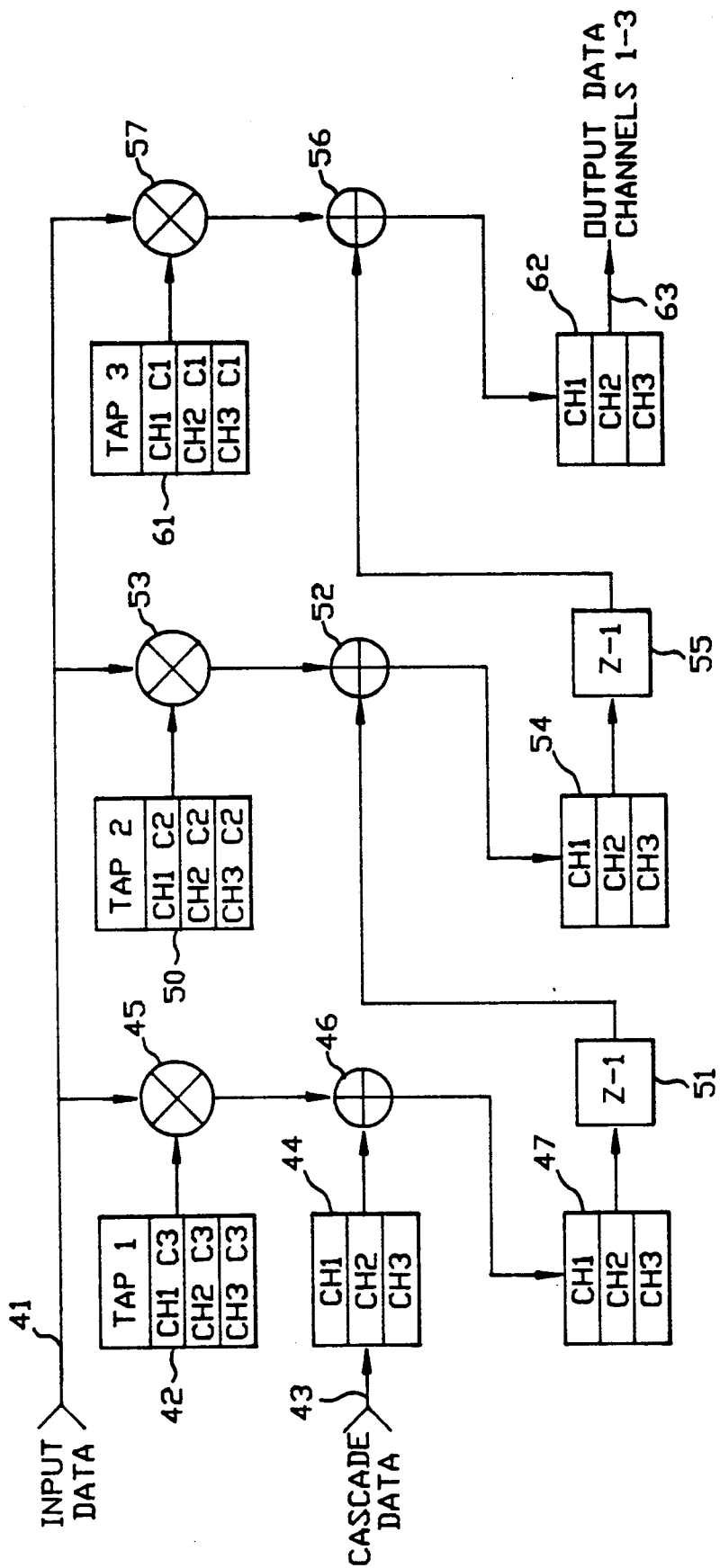
FIG. 3 is a simplified block diagram of the filter architecture of the present invention.

A simplified version of the filter architecture of the invention is shown in FIG. 3. This filter uses a single pipeline of parallel multipliers/accumulators, similar to the common architecture, but has the addition of random access memory and uses multiplexing circuitry which allows multichannel filter capability. Data enters the filter on line 41 while memory 42 stores coefficient C3 and is represented by the designation "TAP 1." If there is a channel preceding that shown in the drawing, it would be applied as multiplexed cascade data through line 43 to memory 44. Coefficient C3 is applied to input data from line 41 sequentially as channels 1, 2 and 3 by means of multiplier 45. The cascade data is then added to the multiplier output, again by multiplexed channels, in summing element 46 and stored in memory 47. The outputs of each of the thus acted upon channels in memory 47 is applied through delay 51 to summing junction 52. In like manner, coefficient C2 from memory 50 (TAP 2) is applied to channels 1, 2 and 3 by means of multiplier 53, then through summing junction 52 to memory 54. The output of that memory is then acted upon by delay 55 and the output of that delay is applied to summing junction 56. Multiplier 57 applies coefficient C1 from memory 61 (TAP 3) to each of the channels in like manner. The output of summing junction 56 is applied to buffer memory 62 and the output of the filter appears on line 63 in a completed, multiplexed fashion.

Note that memory is used to store the channel coefficients (42, 50 and 61) and results of the sum-of-products operation (47, 54 and 62). The multiplexing function is segmented into two parts. The first part controls the channel coefficient memory to be applied to the input data path and the second part controls the sum-of-products memory.

Figure 4A:
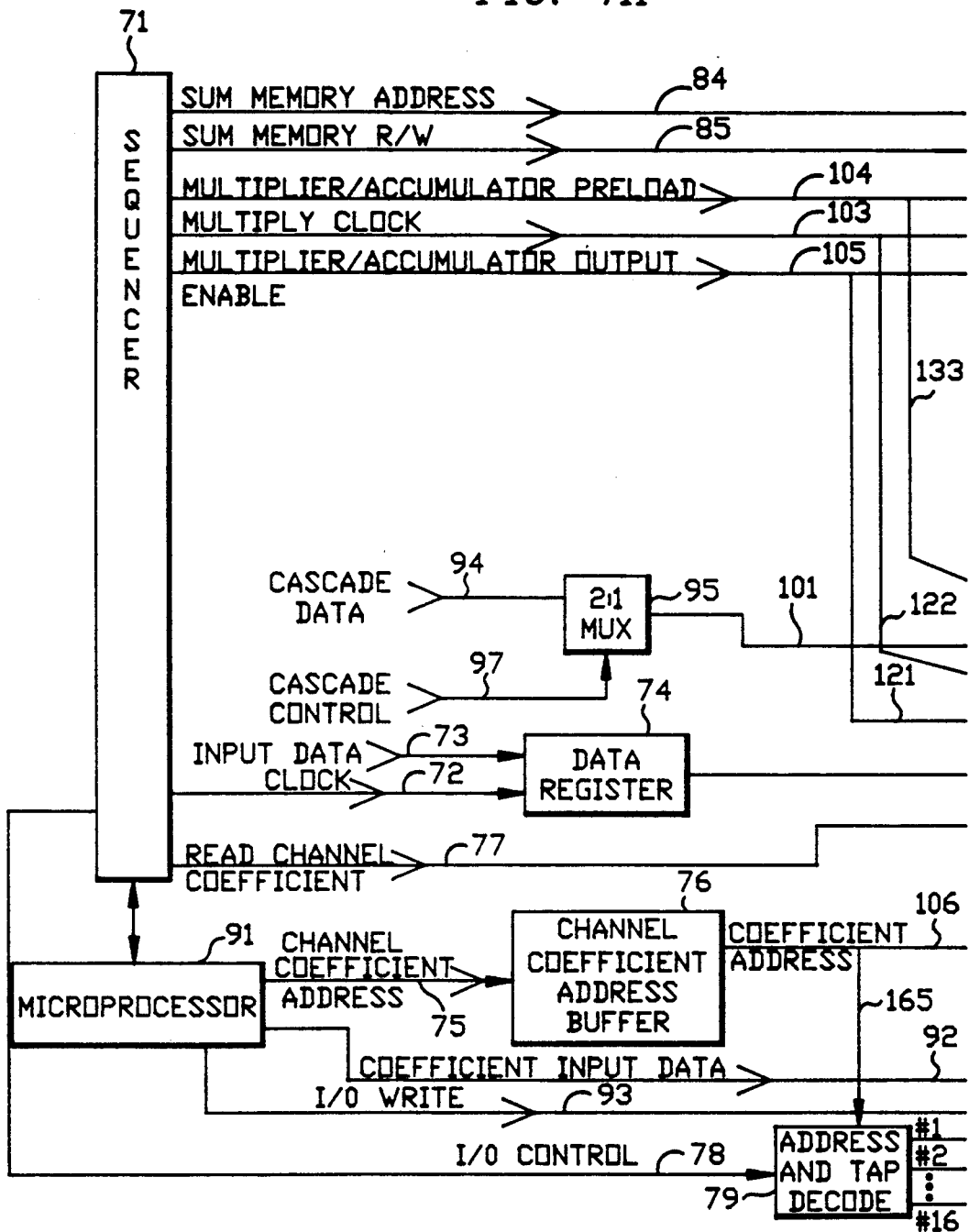
FIGS. 4A and 4B together show the full schematic representation of the digital filter architecture of the invention.
Figure 4B:
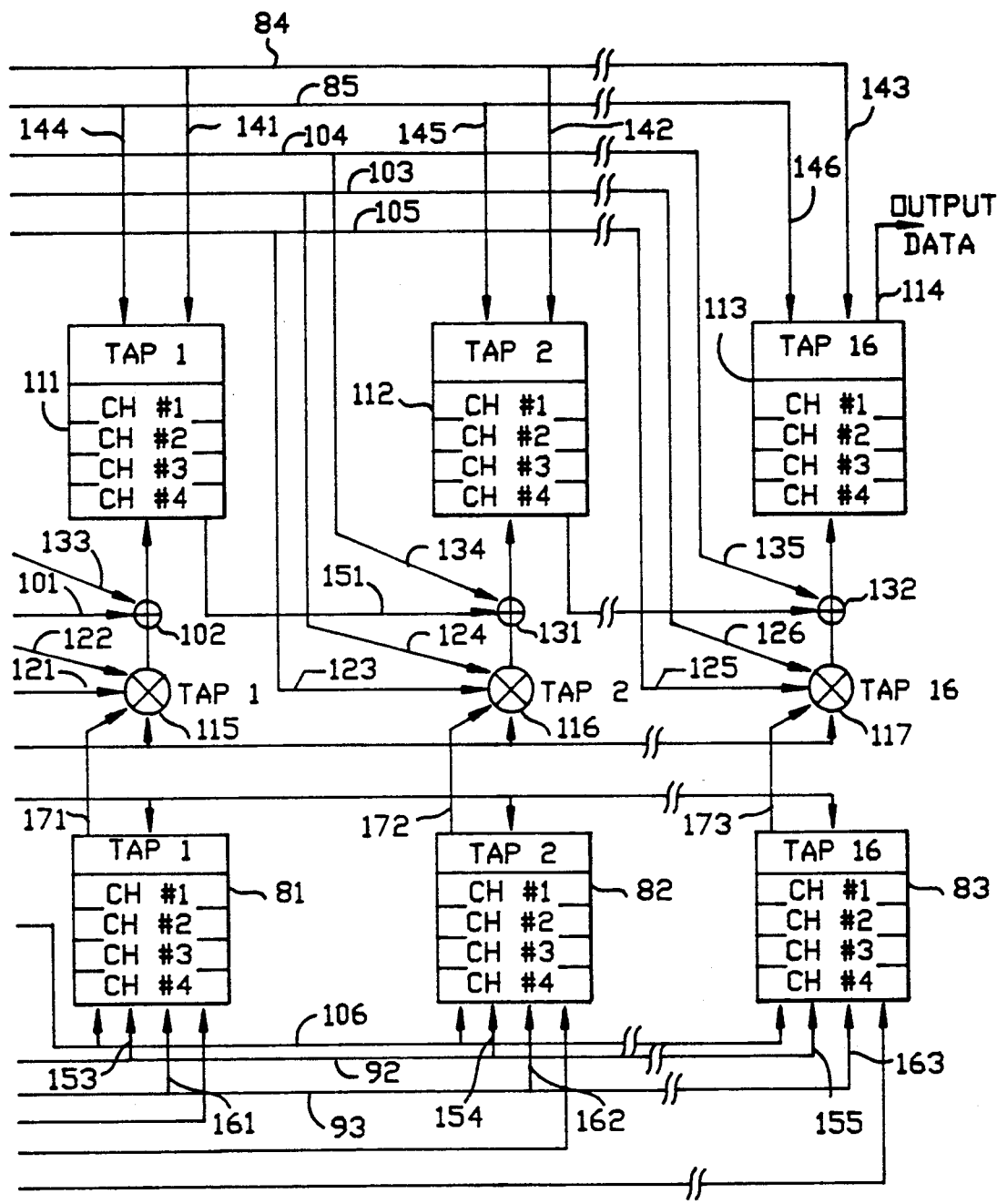

Reference will now be made to the more detailed representation of the filter architecture of the invention shown in FIG. 4. This expansion of the FIG. 3 representation shows 16 coefficients operating on the multiplexed input signals. The coefficient memories and the summing junction output memories are inverted when compared with FIG. 3, but only in the visual representation. The connections are not changed. The channel coefficient data multiplexer utilizes a number of control signals and hardware functions. The control signals all originate in sequencer 71. The clock signal on line 72 latches the information on input data lines 73 into data register 74. Channel coefficient address lines 75, together with their buffer 76, are used to address the appropriate channel. The read channel coefficient signal on line 77 controls channel coefficient memories 81 (TAP 1), 82 (TAP 2) and 83 (TAP 16).

To initially set up operation of the filter, the values of the channel coefficients are downloaded into memories 81, 82 and 83 from microprocessor 91 through coefficient input data lines 92. Signals from the microprocessor on input/output write lines 93 determine what coefficient value is put into which channel coefficient memory segment.

The sum-of-products memory multiplexing function uses sum memory address lines 84 and sum memory read/write signals 85 for its control.

When the filter is connected for cascaded operation, initial sequence cascade data is applied on line 94 through 2:1 multiplexer 95 which is controlled by cascade control signal 97. If, as shown in FIG. 4, it is the first filter sequence, there will be no cascade data and those inputs will be zero. Cascade data is applied to summing junction 102 through line 101, and is stored in memory 111. That process is repeated for each filter sequence in similar manner.

Control signals for the multipliers/accumulators come from the sequencer. These signals are multiply clock 103, multiplier/accumulator preload 104 and multiplier/accumulator output enable 105.

the three channels of the multichannel FIR filter architecture of the invention are shown in Table 2.

TABLE 2

| DATA SAMPLE | TAP 1 OUTPUT FROM MEMORY 47 | TAP 2 OUTPUT FROM MEMORY 54 | TAP 3 OUTPUT FROM MEMORY 62 |
|---|---|---|---|
| | | CHANNEL 1 | |
| D1 | D1 × C3 | D1 × C2 | D1 × C1 |
| D4 | D4 × C3 | (D1 × C3) + (D4 × C2) | (D1 × C2) + (D4 × C1) |
| D7 | D7 × C3 | (D4 × C3) + (D7 × C2) | (D1 × C3) + (D4 × C2) + (D7 × C1) |
| | | CHANNEL 2 | |
| D2 | D2 × C3 | D2 × C2 | D2 × C1 |
| D5 | D5 × C3 | (D2 × C3) + (D5 × C2) | (D2 × C2) + (D5 × C1) |
| D8 | D8 × C3 | (D5 × C3) + (D8 × C2) | (D2 × C3) + (D5 × C2) + (D8 × C1) |
| | | CHANNEL 3 | |
| D3 | D3 × C3 | D3 × C2 | D3 × C1 |
| D6 | D6 × C3 | (D3 × C3) + (D6 × C2) | (D3 × C2) + (D6 × C1) |
| D9 | D9 × C3 | (D6 × C3) + (D9 × C2) | (D3 × C3) + (D6 × C2) + (D9 × C1) |

The FIR filter of this invention can efficiently perform the basic filter functions, including lowpass, highpass, bandpass and stopband filtering. The implementation of the specific filter function is accomplished by programming the required set of coefficients in the convolution sum equation (Eq. 2) for the desired filter functions. This is accomplished through the microprocessor and its typical entry keyboard or automatic data entry as may have been predesignated on tape or disc.

The programming of the filter is accomplished by presenting an address on line 106 that corresponds to a location in the channel coefficient memory (81, 82, 83), putting the coefficient value on coefficient input data lines 92 and activating the required control line (I/0 write) 93.

In relation to FIG. 3, convolution sums are stored in memories 111, 112 and 113. The output appears on line 114 from the last in the sequence memory elements 113. These memories incorporate the delays (51 and 55) of FIG. 3.

Operation of the filter is accomplished by performing the convolution sum equation (Eq. 2) in hardware. The following discussion will provide an example of how this equation is implemented. The data flow for the three tap single-channel filter of FIG. 2 is given in Table 1. Note that the output shows the sum-of-products that is required by the convolution sum.

Data samples 1, 4, 7 correspond to the first three samples for channel 1. Data samples 2, 5, 8 correspond to the first three samples for channel 2. Data samples 3, 6, 9 correspond to the first three samples for channel 3.

Filter hardware operation can conveniently be divided into four parts. With reference to FIG. 4, the first part includes signals for the acceptance of input data and cascade data, and the clocking needed for these data. Cascade data is input on line 94 and is controlled by the signal on line 97. Input data enters on line 73, clocked by signals on line 72.

The second part of the filter operation relates to control of the multipliers/accumulators. The signals needed for operation of this hardware include multiplier/accumulator preload 104, multiply clock 103 to perform the multiply/accumulate operation, and multiplier/accumulator output enable 105 for the enabling of the results. The enable and clock signals control the operation of multipliers 115, 116 and 117 through lines 121, 122, 123, 124, 125 and 126 respectively. The preload signal is applied to summing junctions 102, 131 and 132 through lines 133, 134 and 135.

The third part of the hardware operation comprises the signals needed to control the sum-of-products memory. These signals are memory address lines 84 and memory read/write lines 85. The sum-of-products memories are referred to as memories 111, 112 and 113. The address signals are applied to these respective

TABLE 1

| DATA SAMPLE | TAP 1 OUTPUT FROM JUNCTION 33 | TAP 2 OUTPUT FROM JUNCTION 36 | TAP 3 OUTPUT FROM JUNCTION 28 |
|---|---|---|---|
| D1 | D1 × C3 | D1 × C2 | D1 × C1 |
| D2 | D2 × C3 | (D1 × C3) + (D2 × C2) | (D1 × C2) + (D2 × C1) |
| D3 | D3 × C3 | (D2 × C3) + (D3 × C2) | (D1 × C3) + (D2 × C2) + (D3 × C1) |
| D4 | D4 × C3 | (D3 × C3) + (D4 × C2) | (D2 × C3) + (D3 × C2) + (D4 × C1) |
| D5 | D5 × C3 | (D4 × C3) + (D5 × C2) | (D3 × C3) + (D4 × C2) + (D5 × C1) |

The output of junction 28 is the output of the filter. This is an example of how the prior art parallel pipeline architecture works.

For multichannel operation as shown in FIG. 3, the data is multiplexed so that data for channel 1 is operated on by the coefficients for channel 1, stored in memories 42, 50 and 61, and the results are stored in memories 47, 54 and 62 for channel 1. This same operation is performed for all the channels.

The multiplexing filter of FIG. 3 will be analyzed in similar fashion for a three channel filter as a simple example. The contents of memory for the three taps and memories on lines 141, 142 and 143. The read/write signals are applied to these memories over lines 144, 145 and 146. These signals are timed in synchronism with the multiplexing functions to provide the correct stored sum-of-products to the next tap in sequence. For example, the stored information from Tap 1 goes through line 151 to summing junction 131.

The fourth part of the filter hardware operation is the control of the coefficient memory. For this hardware architecture, control is needed to load the coefficient value from an external source, typically microprocessor 91. The signals to do this appear on several lines, which include coefficient input data lines 92, input/output write line 93, channel coefficient address lines 75 and input/output control line 78. The coefficient input data is generated by the microprocessor, the output of which are data lines 92. These are connected to coefficient memories 81, 82, 83 through respective lines 153, 154 and 155. The signal to write coefficient data comes in from line 93 on lines 161, 162 and 163. Meanwhile channel coefficient address signals from microprocessor 91 over lines 75 are stored in buffer 76. The input/output control signals from sequencer 71 over line 78 are fed to address and tap decoder 79 which then addresses each coefficient memory pursuant to a signal from buffer 76 over line 165. A separate line is connected to each coefficient memory from decoder 79. By means of this portion of the filter, coefficient data is properly stored by channel in each coefficient memory. That the proper coefficient is stored in the proper channel is determined by the decoder pursuant to the control signal on line 78. Once the coefficient values are loaded, read channel coefficient signal 77 is used to read the coefficients for use in the multipliers during filter hardware operation. The coefficient data is fed from respective memories 81, 82 and 83 to multipliers 115, 116 and 117 over lines 171, 172 and 173.

The control required for proper and efficient filter operation is provided by external sequencer 71. This sequencer, which is programmable, produces the actual control signals with the appropriate timing for operation of the filter hardware. Because the sequencer is programmable, the user can choose how to control the filter. For example, each filter channel can be sampled at a different sample period, such as four microseconds for channel 1, eight microseconds for channel 2, twelve microseconds for channel 3, and so on.

Figure 5:
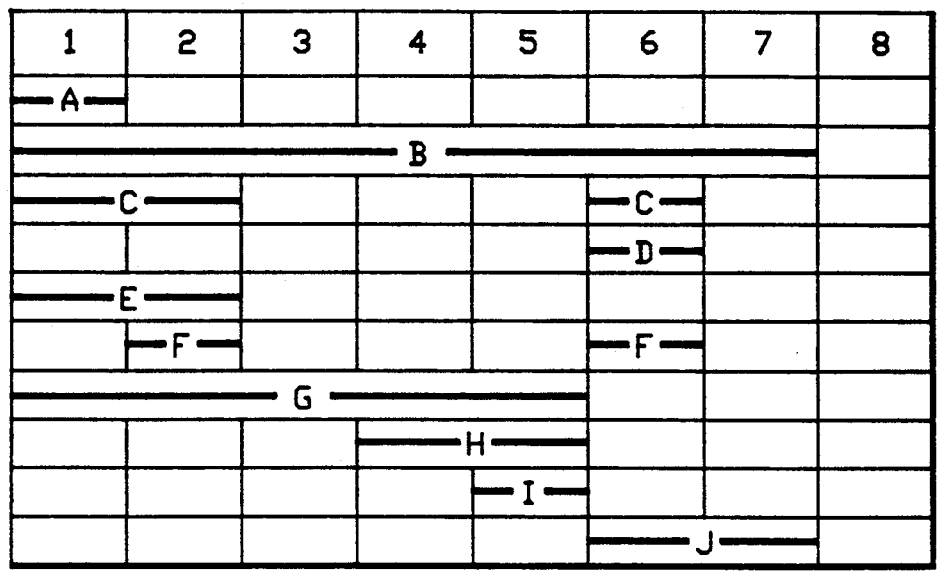
FIG. 5 is a timing table representation showing the various filter operations in relation to each other throughout the eight time slots, which are repetitive.

The operation of the filter, after the coefficients have been downloaded, can be divided into eight time slots (eight clock pulses). Within each slot, single or multiple filter hardware operations are performed. FIG. 5 shows the filter operations and which time slots are utilized for each filter operation. In time slot 1, data is clocked into the filter (lines 72, 73 and buffer 74) during a single time segment A. In seven segment time slot B the filter presents address to sum-of-products memories 111, 112, 113 on line 84. During time periods C read control on line 85 is applied to the sum-of-products memories. Write control on line 85 is applied to sum-of-products memories in time segment D. The signal on line 104 is applied during time segment E to preload the multipliers/accumulators. The multiply clock signal 103 is operative during time slots F and is applied to the multipliers. Coefficient random access memory (RAM) address signals occur during time segment G on lines 106. During time slot H read control signals occur for channel coefficient memories on line 77. Clock multiplier/accumulator signals 104 are applied to the summing junctions during time slot I for input register purposes. And enable multiplier/accumulator output signals 105 occur in time segment J.

By way of contrast of this invention with typical prior art digital filters, many such prior art devices operate in a serial manner and have delay/storage devices in the input data path as well as in the partial sums path. The architectures of this invention has no need for input path delay/storage devices. Further, it operates on data in a parallel manner. A resulting advantage is simplification of control of the filter because only a single simple addressing device is needed to address all of the taps of the filter. This filter employs delay elements only in the partial sums paths and these delay elements are random access memories (RAM). There is only one delay element per tap of the filter. Note that Ram is also used as the storage device for the tap coefficients. Control of the new filter requires only one counter, or addressing device, to control all memory (both coefficients and partial sums) accesses.

A significant distinguishing feature of the invention is the extensive use of RAM for both the coefficients and the partial sum-of-products delay elements. This permits the use of multiplexing techniques that can accommodate multiple channels of input data. Using the RAM feature results in many advantages. It makes it possible to provide many filters within the same hardware so that a single input can be supplied by many different channels (sources) that are time multiplexed. The number of channels that can be processed by this architecture is dependent upon the required sample rate of the channels, how fast the hardware implementation of the filter can operate, and type and depth of the RAM used.

Additionally, the use of RAM for the storage of coefficients in this architecture allows the filter hardware to be programed and reprogrammed for the desired filter function. This means the filter function can be changed without any change to the hardware, thereby permitting the hardware to be of a generic nature. Also, by using dual-port type RAM for storage of the coefficients, adaptive filtering can be achieved. Adaptive filtering can be performed during filter operation because coefficients an by dynamically changed while the filter is operating. This can be explained as follows: during multichannel operation, an external device, for example, microprocessor 91, can write new coefficients to one or more channels, and have no impact whatever on the other channels being sampled. Of course, the output of each channel whose coefficient has been changed will experience a delay until it becomes valid again.

Figure 6A:
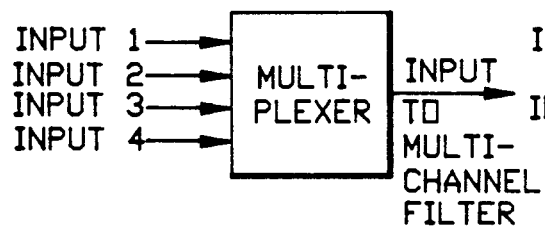
FIGS. 6A, 6B, 6C and 6D show examples of several configurations for inputs to the multichannel filter of the invention.
Figure 6B:
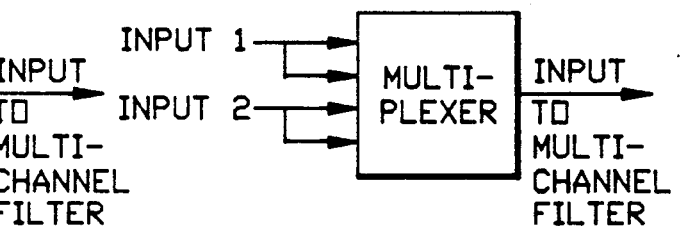
Figure 6C:
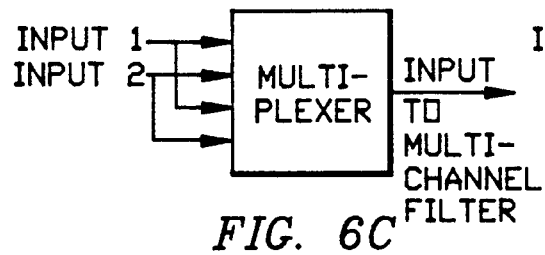
Figure 6D:
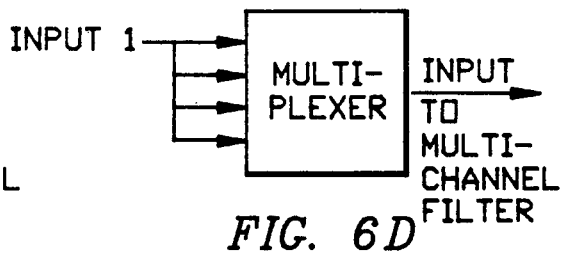

There are several advantages resulting from this multichannel filter architecture. A significant one is the ability to perform the same or different filter functions on a single signal input composed of either a single input or multiple time multiplexed inputs without the need for individual hardware for each implemented filter function. Although a single input has been shown and discussed, the filter of this invention can as easily multiplex and sample one input or several inputs. For example, FIGS. 6A, 6B, 6C and 6D show alternative multichannel filter configurations for one or several inputs. In FIG. 6A there are four separate inputs while FIG. 6D has a single input split into the multiplexed samples as discussed throughout this description.

Another advantage is that because the filter hardware, the sequencer and the microprocessor are all digital, it allows filter functions to be programmable and reprogrammable. A particular resulting advantage is that the filter functions can be changed by software rather than requiring a redesign of hardware for a new filter function.

With this multichannel filter architecture, each channel operates as an individual filter, thereby allowing unique filter functions to be implemented without relying on additional hardware or software, except for the external sequencer. Since the external sequencer is user programmable, and controls the clock to the filter, each individual filter can have a different sampling speed, thereby further enhancing the flexibility when designing a filter function.

A further advantage, when considering its vast capability, is reduced size and power consumption in comparison with the multiple filters needed for equivalent functions.

In view of the above description it is likely that those skilled in this technical area will conceive of modifications and improvements which are within the scope of the accompanying claims.

What is claimed is:

1. A single parallel pipeline multichannel digital filter for operating on input data from an external source, said filter comprising:

means connected to the source of input data;

a plurality of tap positions arranged in parallel to simultaneously tap off a plurality of samples from said input data connection means in a sequence of channels of input data;

programmable multichannel coefficient memory means at each tap position, each said channel having a predetermined coefficient assigned thereto, each said channel comprising:

a) means for sequentially multiplying input data in said channel by said predetermined coefficient for that channel;

b) means for adding delayed cascade data, from a prior memory means associated with a preceding channel in said sequence of channels, to the output of each said multiplying means;

c) memory means for storing the sum of the products of said channel input sample multiplied by its respective coefficient and the delayed cascade data from a preceding source; and an output line from the last of said memory means for transmission of the output signal of said filter, the output signal on said output line being a sequence of sum-of-products.

2. The filter recited in claim 1, and further comprising:

sequencing means coupled to said coefficient memory means and to said sum-of-products memory means for sequencing the input data for operation thereon by the coefficients in predetermined sequence.

3. The filter recited in claim 2, and further comprising means in said sequencing means for multiplexing the input data for appropriate coefficient multiplication.

4. The filter recited in claim 3, wherein said sequencing and multiplexing means sample the input data to divide it into a sequence of channels, and specific coefficients are applied in predetermined order to each channel.

5. The filter recited in claim 2, and further comprising means for initializing the coefficients in said coefficient memory means, said initializing means comprising:

input programming means coupled to said sequencing means and to said coefficient memory means to create values for the coefficient input data;

control means, having an input coupled to said sequencing means and an output coupled to said coefficient memory means, to write coefficient data in each said coefficient memory means;

means for generating channel coefficient address signals, said means for generating having an input coupled to said input programming means and an output coupled to said control means and to said coefficient memory means; and means for generating control signals to enable the channel coefficient address signal to control the writing of coefficient data in said coefficient memory at each said tap position.

6. The filter recited in claim 2, wherein said sequencing means is programmable, thereby enabling the filter to have different operational control signals.

7. The filter recited in claim 1, wherein each said sum-of-products memory means comprises random access memory means.

8. The filter recited in claim 1, wherein each said coefficient memory means comprises random access memory means.

9. A method for digital filtering of multiple samples of data on a single input parallel pipeline from an external source, said method comprising the steps of:

connecting a first plurality of taps to the single input parallel pipeline in a parallel arrangement, each tap having a second plurality of channels;

tapping off a multiplicity of samples of the input data from the input line;

loading a first plurality of coefficients in memory, one coefficient for each respective coefficient memory means;

sequentially multiplying a predetermined coefficient by one of the data samples to form a product;

adding delayed products from other multiplying steps to the product so formed;

sorting each sum-of-products thus formed;

sequentially providing as an output the sum of products so created;

initializing the coefficients in the coefficient memory by:

creating values for the coefficient input data;

writing coefficient data in each coefficient memory;

generating channel coefficient address signals; and generating control signals to enable the channel coefficient address signals to control the writing of the coefficient data in the coefficient memory at each predetermined tap position.

* * * * *